Dec. 6, 1966 M. K. AVEDISSIAN 3,290,479

APPARATUS FOR BONDING

Filed Dec. 9, 1963 3 Sheets-Sheet 1

INVENTOR
M.K. AVEDISSIAN
By M. Goffer
ATTORNEY

Dec. 6, 1966 M. K. AVEDISSIAN 3,290,479

APPARATUS FOR BONDING

Filed Dec. 9, 1963 3 Sheets-Sheet 2

Dec. 6, 1966 M. K. AVEDISSIAN 3,290,479

APPARATUS FOR BONDING

Filed Dec. 9, 1963 3 Sheets-Sheet 3

United States Patent Office 3,290,479
Patented Dec. 6, 1966

3,290,479

APPARATUS FOR BONDING

Michael K. Avedissian, Mohnton, Pa., assignor to Western Electric Company, Incorporated, New York, N.Y., a corporation of New York Filed Dec. 9, 1963, Ser. No. 328,989
11 Claims. (Cl. 219—85)

This invention relates to apparatus for bonding and, more particularly, to apparatus for controlling the heat supplied during the bonding of two pieces of material to each other.

In the fabrication of semiconductive devices, for example, transistors, a semiconductor wafer is placed in contact with a metallic header which serves as a support therefor and bonded thereto by the application of heat. The bond between the wafer and the header occurs when the interface therebetween reaches a temperature sufficient to cause alloying, that is, when the temperature at the interface reaches the eutectic temperature of the constituent materials of the two parts.

One of the problems involved in the bonding is accurate control of the heat supplied. Too much heat results in a degradation of the electrical characteristics of the transistor; too little heat, on the other hand, results in insufficient bonding. Accordingly, there is a need for apparatus which will accurately control the heat supplied during the bonding of one piece of material to another piece of material.

One approach taken previously in this regard, has been to use a heat control system employing a conventional temperature measuring device, such as a thermistor. Devices of this type, however, have an inherently slow response time and, accordingly, too great a time lag exists between the occurrence of the eutectic temperature and the response of the system to this temperature.

To overcome this disadvantage of conventional temperature measuring devices, another approach, taken in the past, has been to use heat control apparatus of this type employing an infrared detector. While this apparatus provides a relatively fast system response time, it has another disadvantage. Infrared heat control systems do not sense temperature, instead, they sense radiated energy which, besides being a function of temperature, is also a function of the radiating area and the coefficient of radiation of this area, i.e., the emissivity thereof. Thus, unless all headers have the same coefficicient of radiation, uniform wafer to header bonding is not possible. In actuality, the headers have not been found to have the same coefficient of radiation and, accordingly, infrared heat control systems have not proven to be entirely satisfactory.

It is therefore an object of this invention to provide new and improved apparatus for bonding.

Another object of this invention is to provide new and improved apparatus for controlling the heat supplied during the bonding of two pieces of material to each other.

A further object of this invention is to provide new and improved apparatus for accurately controlling the heat supplied during the bonding of a semiconductor wafer to a header.

Apparatus illustrating certain features of the invention may include means for supplying heat to two pieces of eutectic forming material to be bonded to each other to cause a eutectic flow, the eutectic flow, upon its occurrence, covering a portion of one of the two pieces of material. Means are provided for projecting a beam of light onto the portion of the piece of material which is to be covered by the eutectic flow, the light reflected from this portion changing upon the occurrence of the eutectic flow. Means responsive to the change in the reflected light are provided for controlling the heating.

A complete understanding of the invention may be had from the following detailed description of specific embodiments thereof, when read in conjunction with the appended drawings, in which.

Illustratively, the invention will be described as being employed in the bonding of a semiconductor wafer to a metallic support member termed a header.

Figure 1:
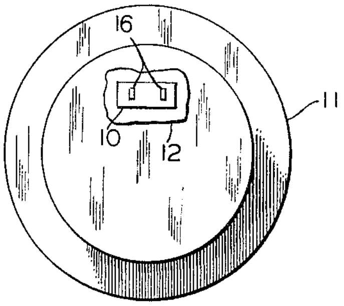
FIG. 1 is an enlarged view, with portions removed for the sake of clarity, of a semiconductor wafer after it has been bonded to a header.

Referring now to the drawings and, particularly to FIG. 1, there is illustrated therein a semiconductor wafer 10 after it has been bonded to a header 11. As seen in FIG. 1, an irregular area 12 surrounds the wafer 10. This irregular area 12 is caused by the eutectic flow which occurs during the bonding when the temperature at the interface of the wafer 10 and the header 11 reaches the eutectic temperature of their constituent materials. It has been found that the eutectic flow, upon its occurrence presents a very smooth surface, i.e., a mirror-like surface. In contrast, the surface of the header 11 prior to the eutectic flow is relatively rough. This difference in surface characteristics forms the basis for the embodiments of the invention to be described hereinbelow.

Figure 2:
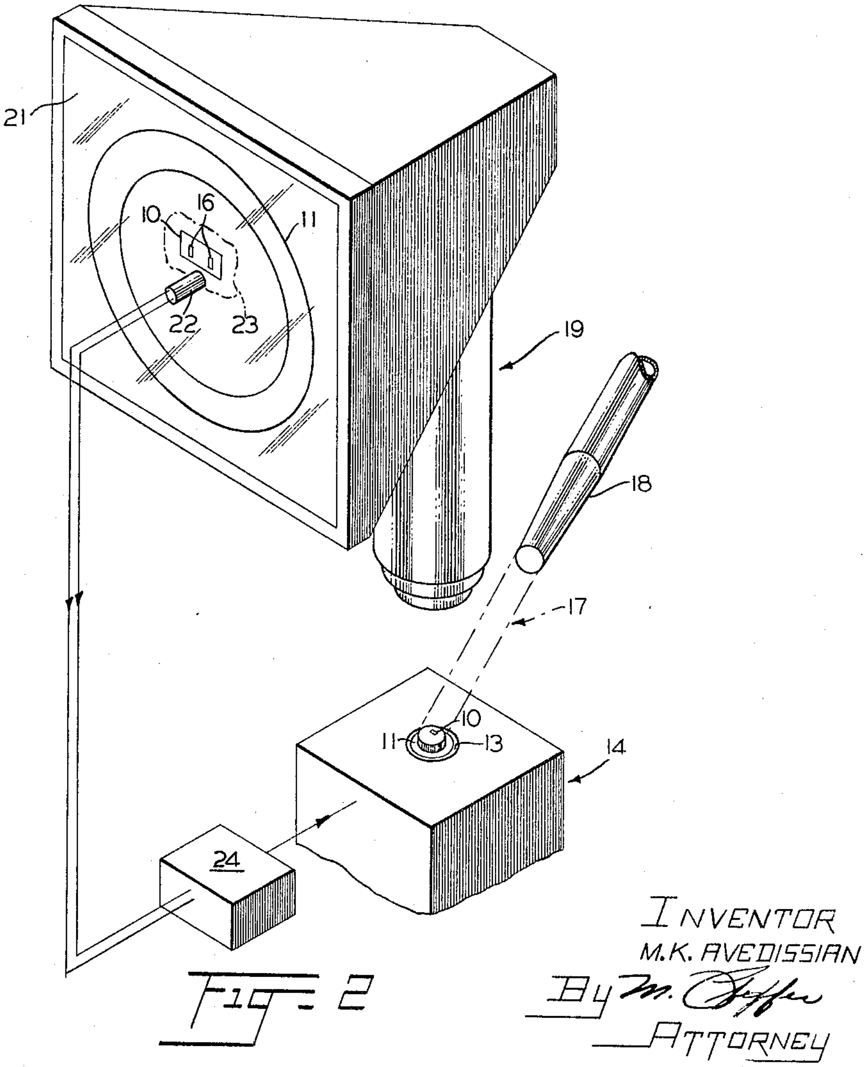
FIG. 2 is a view, partly schematic, and with portions removed and broken away for the sake of clarity, of apparatus forming one embodiment of the invention.

Referring now to FIG. 2, the header 11, the top surface of which is gold plated, is supported in a nest 13 of a conventional heating unit 14. Seated atop the header 11 is the semiconductor wafer 10, which, in the present instance, has a pair of contact stripes 16—16 on its top surface. The wafer 10 may be composed of any suitable semiconductor material, such as germanium or silicon. Suitable means (not shown) may be provided for urging the wafer 10 into firm contact with the header 11.

An intense beam of light 17 from a suitable source 18, angularly disposed with respect to the surface of the header 11 is projected onto the header to cause irradiation thereof. Because of the relative roughness of the gold plated surface of the header, the incident light 17 from the light source 18 is reflected from the surface of the header 11 in a multitude of directions, i.e., the reflected light is diffused. This diffused, reflected light is magnified by a suitable instrument, such as a comparator 19, and directed to a screen 21 thereof. A photocell 22 is positioned with respect to the screen 21 in a manner such that it senses essentially only the light reflected from a portion 23 of the header 11 which is to be covered by the eutectic flow.

The photocell 22 is connected in a circuit, designated generally by the reference numeral 24, which functions to control the operation of the heating unit 14 in accordance with the amount of light received by the photocell. Referring in detail to the circuit 24 (FIG. 3), it is seen that the photocell 22 is connected as one arm of a Wheatstone bridge. The arm adjacent to the photocell 22 is provided with a variable resistor 26, and the arms opposite thereto are provided with identical resistors 27—27, respectively. A D.C. voltage source 28, with polarities as shown, is connected across points *a* and *b* of the bridge to supply energizing voltage thereto. One of the output terminals of the bridge, point *c*, is connected to the emitter 29 of a transistor 31 and the other output terminal, point *d*, is connected to the base 32 of the transistor 31. The collector 33 of the transistor 31 is connected through a relay 34 to a suitable source of biasing voltage e.g., point *a* of the bridge.

A normally closed contact 36 of the relay 34 and a normally open bonding initiation switch 37 are connected serially to the heating unit 14 and function to control the operation thereof, the heating unit being on when both the contact 36 and the switch 37 are closed and being off when either one is open.

Figures 4A, 4B:
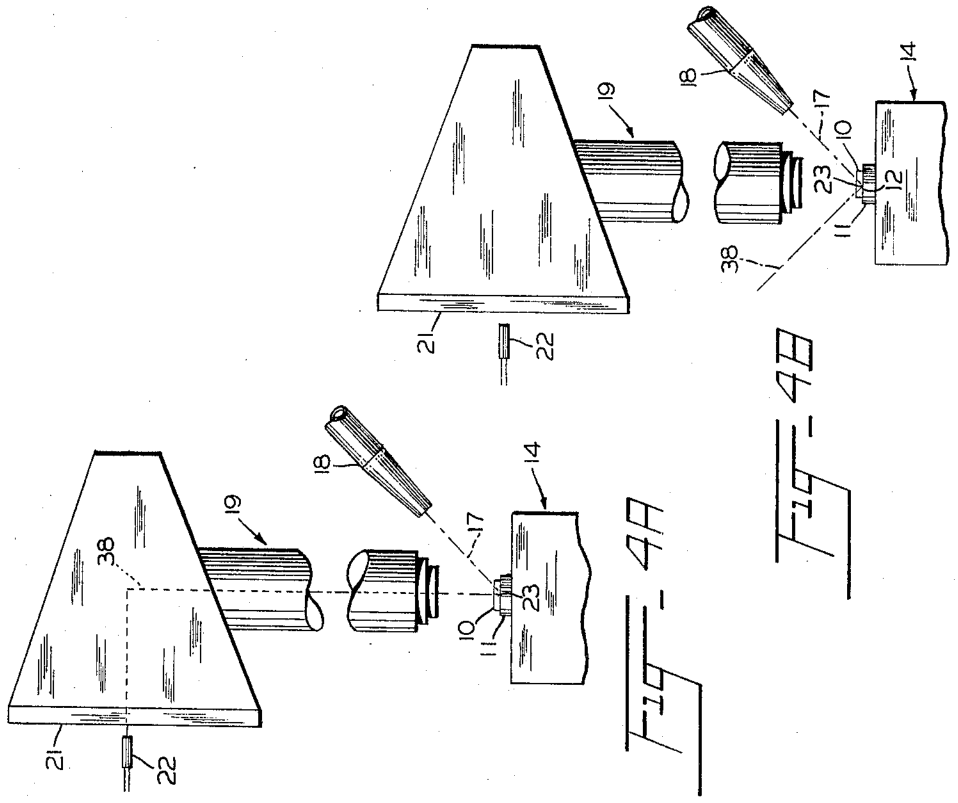
FIGS. 4A and 4B are views illustrating, respectively, the character of the light reflected from a header prior to and immediately after the occurrence of a eutectic flow.

Prior to initiation of the bonding operation, the variable resistor 26 is adjusted so that its resistance is equal to that of the photocell 22, which has a relatively low resistance at this time in view of its receipt of diffused, reflected light 38 from the header portion 23 (FIG. 4A). Since arms *a–d* and *d–b* of the bridge are provided with equal resistors 27—27, adjustment of the resistor 26 so that the resistance thereof is equal to the resistance of the photocell 22 balances the bridge and places the points *c* and *d* at the same potential. As a result no base-emitter current is supplied to the transistor 31 to turn it "ON" and, hence, to energize the relay 34.

The apparatus is now in readiness for initiation of the bonding. Accordingly, the switch 37 is closed to turn on the heating unit 14, whereby heat is supplied to the header-wafer interface. When the temperature at the interface reaches the eutectic temperature of the constituent materials of the wafer 10 and the surface of the header 11, a eutectic flow 12 occurs which covers the portion 23. Illustratively, for a wafer 10 of germanium the eutectic flow occurs at the germanium-gold eutectic temperature 356° C. and for a wafer 10 of silicon the eutectic flow occurs at the silicon-gold eutectic temperature 370° C. As previously mentioned, the eutectic flow 12 has a mirror-like surface; accordingly, the light 38 from the header portion 23 is now reflected according to the Law of Reflectivity, that is, the reflection is now substantially regular or specular in nature and the angle between the reflected light beam 38 and the normal to the header surface is substantially the same as the angle between the incident light beam 17 and the normal to the header surface. Thus, as seen in FIG. 4B, little, if any, light is now received by the photocell 22, whereupon the resistance thereof increases substantially. This increase in resistance causes the voltage at point *d* to fall below that of point *c* which, in turn, results in base-emitter current being supplied to the transistor 31 to turn it "ON" and thereby energize the relay 34. Energization of the relay 34 opens the normally closed contact 36 thereof and turns off the heating unit 14. Optionally, energization of the relay 34 may be employed to turn on a cooling unit (not shown).

Figure 5:
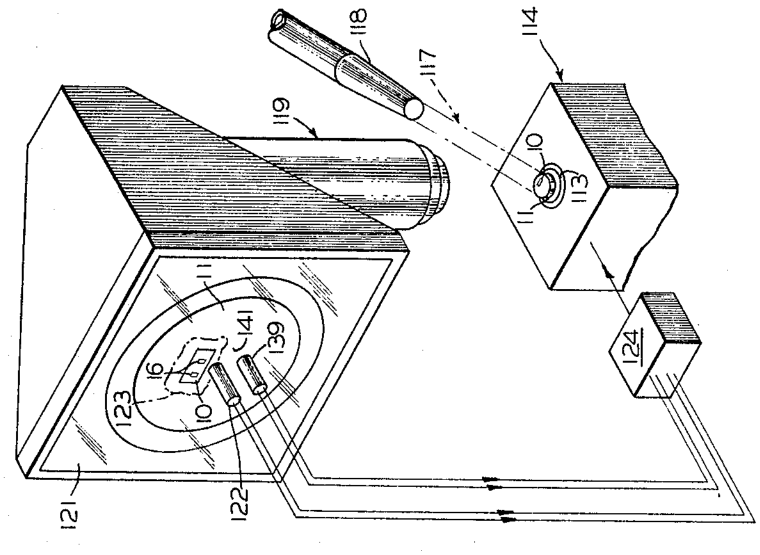
FIG. 5 is a view, partly schematic, and with portions removed and broken away for the sake of clarity, of apparatus forming another embodiment of the invention.

Referring now to FIG. 5, there is shown apparatus forming another embodiment of the invention. This embodiment of the invention includes a heating unit 114 having a nest 113, a light source 118, a comparator 119 having a screen 121 and a photocell 122, all of which are identical in structure, function and arrangement to those in the previous embodiment. Additionally, this embodiment includes a photocell 139 which is positioned with respect to the screen 121 in a manner such that it senses the light reflected from a portion 141 of the header 11 which is not to be covered by the eutectic flow 12. Of course, the photocell 139 in this instance sees the same amount of light prior to and after the occurrence of the eutectic flow 12, an amount, moreover, which is the same as that seen by the photocell 122 prior to the occurrence of the eutectic flow.

Figure 3:
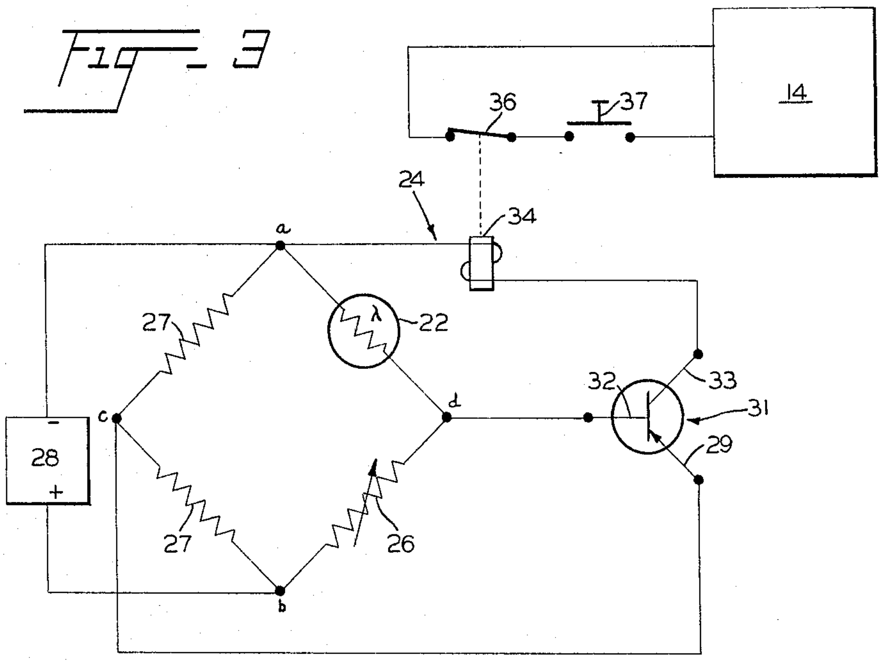
FIG. 3 is a schematic of an electrical circuit forming a part of the apparatus depicted in FIG. 2.
Figure 6:
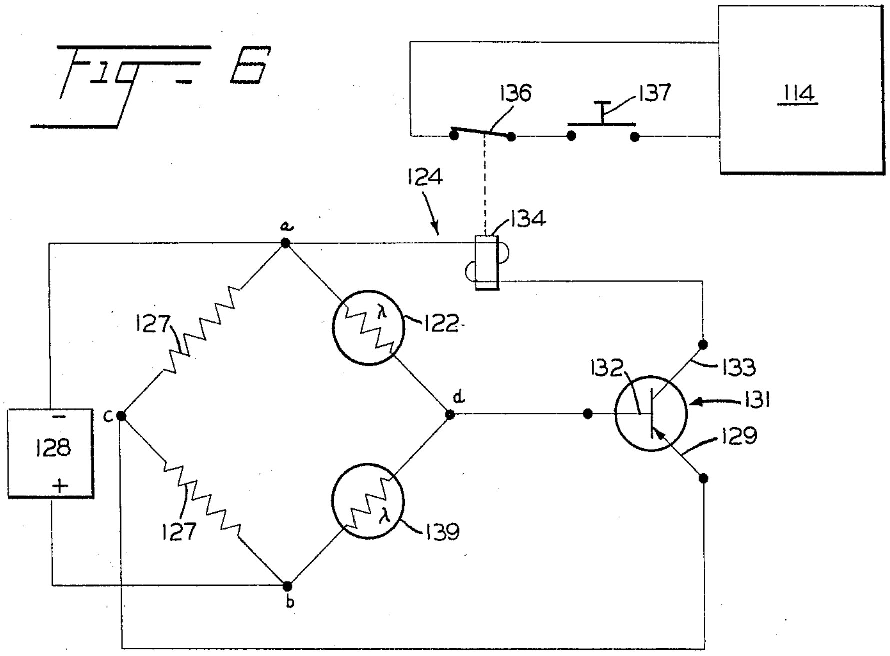
FIG. 6 is a schematic of an electrical circuit forming a part of the apparatus depicted in FIG. 5.

As seen in FIG. 6, the photocells 122 and 139 are connected in a circuit 124 which is similar in arrangement to that of FIG. 3, the photocell 122 being connected in the arm *a–d* and the photocell 139 being connected in the arm *d–b*. As before, a D.C. voltage source 128 is connected across points *a* and *b* of the bridge and equal resistors 127—127 are provided in the arms *a–c* and *c–b*, respectively, thereof. Since the photocells 122 and 139 see the same amount of light prior to the initiation of the bonding and, hence, have equal resistance values, the bridge is balanced and no voltage appears across points *c* and *d* thereof. This self-balancing feature of the instant embodiment is extremely desirable since it eliminates balancing the bridge prior to each bonding operation which, of course, would be necessary in the previous embodiment where the headers 11 are not plated uniformly, i.e., do not have the same surface characteristics. A transistor 131, a relay 134, a normally closed contact 136 of the relay 134 and a normally open bonding initiation switch 137, all of which are similar in structure, function and arrangement to those previously described, are provided to complete the circuit 124.

Bonding with this embodiment of the invention is carried out in the same manner as that described for the embodiment of FIG. 2, the resistance of the photocell 139 remaining constant throughout the bonding and the resistance of the photocell 122 increasing upon the occurrence of the eutectic flow 12.

It should be obvious that while the embodiments of the invention described hereinabove have relied upon a difference in surface smoothness, a difference in surface color or other reflection criteria would work just as well. Additionally, it should be obvious that it is immaterial whether the photocell employed to sense the light reflected from the area to be covered by the eutectic flow senses more or less light upon the occurrence thereof, the only essential factor being that it senses a difference.

It is to be understood that the above-described embodiments are merely illustrative of the principles of the invention. Other embodiments may be devised by a person skilled in the art which embody these principles and fall within the spirit and scope thereof.

What is claimed is:

1. Apparatus for bonding two pieces of eutectic forming material to each other, which comprises:

means for supplying heat to two pieces of eutectic forming material to be bonded to each other to cause a eutectic flow, said eutectic flow upon its occurrence covering a portion of at least one of said two pieces of material;

means for projecting a beam of light onto the portion of said one piece of material to be covered by the eutectic flow, the light reflected from said portion changing upon the occurrence of the eutectic flow; and means responsive to the change in the reflected light from said portion for controlling the heating of said two pieces of material.

2. Apparatus for bonding two pieces of eutectic forming material to each other, which comprises:

means for supplying heat to two pieces of eutectic forming material to be bonded to each other to cause a eutectic flow, said eutectic flow upon its occurrence covering a portion of at least one of said two pieces of material;

means for projecting a beam of light onto the portion of said one piece of material to be covered by the eutectic flow, the light reflected from said portion changing upon the occurrence of the eutectic flow; and photoelectric means responsive to the change in the reflected light from said portion for controlling the heating of said two pieces of material.

3. Apparatus for bonding two pieces of eutectic forming material to each other, which comprises:

means for supplying heat to two pieces of eutectic forming material to be bonded to each other to cause a eutectic flow, said eutectic flow upon its occurrence covering a portion of at least one of said two pieces of material;
means for projecting a beam of light onto the portion of said one piece of material to be covered by the eutectic flow, the light reflected from said portion being substantially diffused prior to covering of said portion by the eutectic flow and being substantially specular after the covering of said portion by the eutectic flow; and
means responsive to the change in said reflected light from a diffused to a specular character for controlling the heating of said two pieces of material.

4. Apparatus for bonding two pieces of eutectic forming material to each other, which comprises:
means for supplying heat to two pieces of eutectic forming material to be bonded to each other to cause a eutectic flow, said eutectic flow upon its occurrence covering a portion of at least one of said two pieces of material;
means for projecting a beam of light onto the portion of said one piece of material to be covered by the eutectic flow, the light reflected from said portion being substantially diffused prior to covering of said portion by the eutectic flow and being substantially specular after the covering of said portion by the eutectic flow;
photoelectric means arranged with respect to said surface portion so as to receive diffused light reflected therefrom but not to receive any specular light reflected therefrom; and
means responsive to the photoelectric means for terminating the heating of said two pieces of material upon the transition of the reflected light from a diffused to a specular character.

5. Apparatus for bonding two pieces of eutectic forming material to each other, which comprises:
means for supplying heat to two pieces of eutectic forming material to be bonded to each other to cause a eutectic flow, said eutectic flow upon its occurrence covering a portion of at least one of said two pieces of material;
means for projecting a beam of light onto the portion of said one piece of material to be covered by the eutectic flow, the light reflected from said portion charging upon the covering of said portion by the eutectic flow;
a photoelectric device arranged with respect to said portion to sense light reflected therefrom, the resistance of said photoelectric device changing upon the change in the light reflected from said portion; and
means responsive to the change in resistance of the photoelectric device for terminating the heating of said two pieces of material.

6. Apparatus according to claim 5 wherein said terminating means includes a Wheatstone bridge circuit and the photoelectric device forms one arm of said Wheatstone bridge, said Wheatstone bridge circuit being arranged such that it is balanced prior to the change in resistance of said photoelectric device and unbalanced after the change in resistance of said photoelectric device.

7. Apparatus for bonding two pieces of eutectic forming material to each other, which comprises:
means for supplying heat to two pieces of eutectic forming material to be bonded to each other to cause a eutectic flow, said eutectic flow upon its occurrence covering a portion of at least one of said two pieces of material;
means for projecting a beam of light onto the portion of said one piece of material to be covered by the eutectic flow and onto a portion of said one piece of material not to be covered by the eutectic flow;
first means for sensing light reflected from said portion to be covered by the eutectic flow, said first means sensing a first amount of light prior to the occurence of the eutectic flow and sensing a second amount of light after the occurrence of the eutectic flow;
second means for sensing light reflected from said portion not to be covered by the eutectic flow, the light sensed by said second means being the same prior to and after the occurrence of the eutectic flow and being substantially the same as that sensed by the first sensing means prior to the occurrence of the eutectic flow; and
means responsive to a difference between the light sensed by said first and second sensing means for controlling the heating of said two pieces of material.

8. Apparatus for bonding two pieces of eutectic forming material to each other, which comprises:
means for supplying heat to two pieces of eutectic forming material to be bonded to each other to cause a eutectic flow, said eutectic flow upon its occurrence covering a portion of at least one of said two pieces of material;
means for projecting a beam of light onto the portion of said one piece of material to be covered by the eutectic flow and onto a portion of said one piece of material not to be covered by the eutectic flow, the light reflected from said first mentioned portion being substantially diffused prior to the covering of said portion by the eutectic flow and being substantially specular after the covering of said portion by the eutectic flow and the light reflected from said second mentioned portion being the same prior to and after the occurrence of the eutectic flow and being substantially the same as that reflected from the first mentioned portion prior to the occurrence of the eutectic flow;
a first photoelectric device for sensing the light reflected from said first mentioned portion, the resistance of said first photoelectric device changing upon the transition of the reflected light from a diffused to a specular character;
a second photoelectric device for sensing the light reflected from said second mentioned portion, the resistance of said second photoelectric device being the same prior to and after the occurrence of the eutectic flow and being substantially the same as that of the first photoelectric device prior to said change in resistance thereof; and
means responsive to a difference in the resistance of said first and second photoelectric devices for terminating the heating of said two pieces of material.

9. Apparatus according to claim 8 wherein said terminating means includes a Wheatstone bridge circuit, the first and second photoelectric devices forming first and second arms of said Wheatstone bridge and equal impedances forming the third and fourth arms thereof, whereby said Wheatstone bridge circuit is balanced prior to the change in resistance of said first photoelectric device and unbalanced after the change in resistance of said first photoelectric device.

10. Apparatus for bonding a semiconductor wafer and a metallic header to each other, which comprises:
means for supplying heat to a semiconductor wafer and a metallic header to be bonded to each other to cause a eutectic flow, said eutectic flow upon its occurrence covering a portion of said header;
means for projecting a beam of light onto the header portion to be covered by said eutectic flow and onto a portion of said header not to be covered by said eutectic flow, the light reflected from said first mentioned header portion being substantially diffused prior to the covering of said header portion by the eutectic flow and being substantially specular after the covering of said header portion by the eutectic flow and the light reflected from said second mentioned header portion being the same prior to and after the occurrence of the eutectic flow and being substantially the same as that reflected from the first mentioned header portion prior to the occurrence of the eutectic flow;

means for magnifying the light reflected from said header portions;

a first photoelectric device for sensing the magnified, reflected light from said first mentioned header portion, the resistance of said first photoelectric device changing upon the transition of the magnified, reflected light from a diffused to a specular character;

a second photoelectric device for sensing the magnified, reflected light from said second mentioned header portion, the resistance of said second photoelectric device being the same prior to and after the occurrence of the eutectic flow and being substantially the same as that of the first photoelectric device prior to said change in resistance thereof; and means responsive to a differnce in the resistance of said first and second photoelectric devices for terminating the heating of said two pieces of material.

11. In an apparatus for eutectic bonding at the interface between a semiconductor wafer seated on a gold plated header, where the constituent materials at said interface will in a cold state perpendicularly disperse a light beam incident at an angle to said interface and in a state of eutectic flow reflect said light beam at said incident angle;

means for projecting a light beam to impinge on said cold interface at said incident angle to perpendicularly disperse portions of said light beam from said interface;

a visual display screen;

magnifying means responsive to said perpendicularly dispersed portions of said light from said interface for projecting an enlarged light image of said interface onto said visual display screen;

photoelectric means for sensing only the enlarged image of said light image of said interface;

a Wheatstone bridge circuit having one arm including said photoelectric means;

means connected in another arm of said bridge for balancing the bridge upon said photoelectric means sensing said light image of said interface;

an output circuit operated by an unbalance condition in said bridge;

a heating means supporting said header and wafer for applying heat to said constituent materials to place the materials at the interface in the eutectic flow state to reflect said light at said incident angle away and remove said light image from said visual display screen to deenergize said photoelectric means and unbalance said bridge to operate said output circuit; and means responsive to the operation of said output circuit for interrupting said heating means.

References Cited by the Examiner

UNITED STATES PATENTS

| | | | |
|---|---|---|---|
| 2,315,282 | 3/1943 | Snow | 250—222 X |
| 2,359,787 | 10/1944 | Peters et al. | 250—215 X |
| 2,415,167 | 2/1947 | Gieseke | 250—210 |
| 2,457,289 | 12/1948 | Warnick | 250—210 |
| 2,604,809 | 7/1952 | Mitchell | 250—222 X |
| 3,083,291 | 3/1963 | Soffa et al. | 219—85 X |
| 3,131,557 | 5/1964 | Hoy | 73—17 |
| 3,161,039 | 12/1964 | Kapff | 73—17 |

RICHARD M. WOOD, *Primary Examiner.*

ANTHONY BARTIS, *Examiner.*

B. A. STEIN, *Assistant Examiner.*